(12) United States Patent
Richter et al.

(10) Patent No.: US 8,927,852 B2
(45) Date of Patent: Jan. 6, 2015

(54) PHOTOVOLTAIC DEVICE WITH AN UP-CONVERTING QUANTUM DOT LAYER AND ABSORBER

(75) Inventors: Hans Jürgen Richter, Palo Alto, CA (US); Samuel Dacke Harkness, IV, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 978 days.

(21) Appl. No.: 12/195,596

(22) Filed: Aug. 21, 2008

(65) Prior Publication Data

US 2010/0043872 A1 Feb. 25, 2010

(51) Int. Cl.
| | |
|---|---|
| *H01L 31/00* | (2006.01) |
| *H01L 31/042* | (2014.01) |
| *H01L 31/055* | (2014.01) |
| *B82Y 20/00* | (2011.01) |
| *H01L 31/0224* | (2006.01) |

(52) U.S. Cl.
CPC .............. *H01L 31/055* (2013.01); *Y02E 10/50* (2013.01); *H01L 31/022466* (2013.01); *B82Y 20/00* (2013.01)
USPC ............ 136/255; 136/246; 136/257; 136/261

(58) Field of Classification Search
USPC .................................................. 136/243–265
See application file for complete search history.

(56) References Cited

U.S. PATENT DOCUMENTS

| | | | |
|---|---|---|---|
| 4,037,014 A | 7/1977 | Gittleman | |
| 4,923,524 A | 5/1990 | Kiss | |
| 5,008,726 A | 4/1991 | Nakagawa et al. | |
| 5,244,509 A * | 9/1993 | Arao et al. | 136/256 |
| 5,482,570 A | 1/1996 | Saurer et al. | |
| 5,487,080 A | 1/1996 | Mukherjee | |
| 5,571,612 A | 11/1996 | Motohiro et al. | |
| 5,614,435 A | 3/1997 | Petroff et al. | |
| 5,705,321 A | 1/1998 | Brueck et al. | |
| 5,720,827 A | 2/1998 | Simmons | |
| 5,888,885 A | 3/1999 | Xie | |
| 6,239,449 B1 | 5/2001 | Fafard et al. | |
| 6,242,326 B1 | 6/2001 | Ro et al. | |
| 6,507,042 B1 * | 1/2003 | Mukai et al. | 257/14 |
| 6,541,788 B2 | 4/2003 | Petroff et al. | |

(Continued)

FOREIGN PATENT DOCUMENTS

| | | | |
|---|---|---|---|
| EP | 1130657 A2 | 5/2001 | |
| EP | 1729347 A2 | 6/2006 | |

(Continued)

OTHER PUBLICATIONS

Petroff, "Epitaxial Growth and Electronic Structure of Self Assembled Quantum Dots", 2003, CRC Press, p. 1-11.*

(Continued)

*Primary Examiner* — Jonathan Johnson
*Assistant Examiner* — Andrew Golden
(74) *Attorney, Agent, or Firm* — Hollingsworth Davis, LLC

(57) ABSTRACT

A photovoltaic apparatus includes an absorber including a first quantum dot layer having a first plurality of quantum dots of a first quantum dot material in a first matrix material, and an up-converter layer positioned adjacent to the absorber layer, the up-converter layer including a second quantum dot layer having a second plurality of quantum dots of a second quantum dot material and a second matrix material.

20 Claims, 1 Drawing Sheet

(56) References Cited

U.S. PATENT DOCUMENTS

| | | | |
|---|---|---|---|
| 6,567,236 B1 * | 5/2003 | Doerner et al. | 428/212 |
| 6,583,436 B2 | 6/2003 | Petroff et al. | |
| 6,596,377 B1 | 7/2003 | Hersee et al. | |
| 6,696,313 B2 | 2/2004 | Park et al. | |
| 6,709,989 B2 | 3/2004 | Ramdani et al. | |
| 6,773,949 B2 | 8/2004 | Holonyak, Jr. et al. | |
| 6,852,920 B2 | 2/2005 | Sager et al. | |
| 6,861,722 B2 | 3/2005 | Graetzel et al. | |
| 6,878,871 B2 | 4/2005 | Scher et al. | |
| 7,005,669 B1 | 2/2006 | Lee | |
| 7,019,333 B1 | 3/2006 | Shields et al. | |
| 7,087,832 B2 | 8/2006 | Scher et al. | |
| 7,087,833 B2 | 8/2006 | Scher et al. | |
| 7,153,360 B2 | 12/2006 | Herman et al. | |
| 7,158,346 B2 | 1/2007 | Liu et al. | |
| 7,227,066 B1 | 6/2007 | Roascheisen et al. | |
| 7,265,375 B2 | 9/2007 | Zhang et al. | |
| 7,294,202 B2 | 11/2007 | Chen et al. | |
| 7,332,211 B1 | 2/2008 | Bulovic et al. | |
| 7,700,936 B2 | 4/2010 | Murakowski et al. | |
| 2003/0010971 A1 * | 1/2003 | Zhang et al. | 257/15 |
| 2004/0038307 A1 | 2/2004 | Lee et al. | |
| 2004/0076948 A1 | 4/2004 | Pettersson | |
| 2004/0146560 A1 | 7/2004 | Whiteford et al. | |
| 2004/0168626 A1 | 9/2004 | Moeck et al. | |
| 2004/0233664 A1 | 11/2004 | Beeson et al. | |
| 2004/0247945 A1 | 12/2004 | Chen et al. | |
| 2004/0250848 A1 | 12/2004 | Sager et al. | |
| 2005/0126628 A1 | 6/2005 | Scher et al. | |
| 2005/0150541 A1 | 7/2005 | Scher et al. | |
| 2005/0155641 A1 * | 7/2005 | Fafard | 136/255 |
| 2005/0201963 A1 | 9/2005 | Dutta | |
| 2006/0003190 A1 | 1/2006 | Abarra et al. | |
| 2007/0006914 A1 * | 1/2007 | Lee | 136/261 |
| 2007/0131161 A1 * | 6/2007 | Sherohman et al. | 257/78 |
| 2008/0092945 A1 | 4/2008 | Munteanu et al. | |
| 2008/0092946 A1 | 4/2008 | Munteanu et al. | |
| 2008/0142075 A1 | 6/2008 | Reddy et al. | |
| 2008/0230795 A1 | 9/2008 | Dias | |

FOREIGN PATENT DOCUMENTS

| | | |
|---|---|---|
| KR | 2005045581 | 5/2005 |
| WO | WO 03079457 A1 * | 9/2003 |
| WO | WO 2006034561 A1 * | 4/2006 |
| WO | WO 2008046147 A1 * | 4/2008 |

OTHER PUBLICATIONS

Paskov et al, Photoluminescence up-conversion in InAs/GaAs self-assembled quantum dots, Aug. 2000, Applied Physics Letters, 77, 812-814.*

U.S. Appl. No. 12/195,520, filed Aug. 21, 2008, Richter et al.

W. Shockley et al., "Detailed Balance Limit of Efficiency of p-n Junction Solar Cells", J. Appl. Physics, vol. 32, No. 3, Mar. 1961, pp. 510-519.

A. J. Nozik, "Quantum Dot Solar Cells", Presented at the NCPV Program Review Meeting, Lakewood, Colorado, Oct. 14-17, 2001, 4 pgs.

P. Wurfel, "Photon up-conversion in the presence of non-radiative recombination", J. Appl. Phys., vol. 92, (2002), 2 pgs.

T. Trupke et al., "Efficient up-conversion of non-concentrated solar radiation for solar cells", Proceedings of the 14th Workshop on Quantum Solar Energy Conversion, Rauris, Salzburg, Osterreich, Mar. 17-23, 2002, 2 pgs.

M. Locascio, "Application of Semiconductor Nanocrystals to Photovoltaic Energy Conversion Devices", Evident Technologies, Aug. 2002, pp. 1-12.

T. Trupke et al., "Improving solar cell efficiencies by up-conversion of sub-band-gap light", J. Appl. Physics, vol. 92, No. 7, Oct. 1, 2002, pp. 4117-4122.

S. Kamprachum et al., "Multi-Stacked InAs/GaAs Quantum Dot Structures and Their Photovoltaic Characteristics", 3rd World Conference on Photovoltaic Energy Conversion, Osaka, Japan, May 11-18, 2003, pp. 259-261.

R. D. Schaller et al., "High Efficiency Carrier Multiplication in PbSe Nanocrystals: Implications for Solar Energy Conversion", Physical Review Letters, vol. 92, No. 18, May 7, 2004, pp. 186601-1-186601-4.

M. C. Hanna et al., "Quantum Dot Solar Cells: High Efficiency through Multiple Exciton Generation", Presented at the 2004 DOE Solar Energy Technologies Program Review Meeting, Denver, Colorado, Oct. 25-28, 2004, 5 pgs.

M. Y. Levy et al., "Quantum Dot Intermediate Band Solar Cell Material Systems With Negligible Valence Band Offsets", Presented at the 31st IEEE Photovoltaics Specialist Conference, Orlando, Florida, Jan. 3-7, 2005, 4 pgs.

M. A. Green et al., "All-Silicon Tandem Cells Based on "Artificial" Semiconductor Synthesised Using Silicon Quantum Dots in a Dielectric Matrix", 20th European Photovoltaic Solar Energy Conference, Barcelona, Spain, Jun. 6-10, 2005, 5 pgs.

C. B. Honsberg et al., "Paths to Ultra-High Efficiency (>50% Efficient) Photovoltaic Devices", 20th European Photovoltaic Solar Energy Conference, Jun. 6-10, 2005, Barcelona, Spain, pp. 453-456.

A. F. Hepp et al., "Inorganic Photovoltaics Materials and Devices: Past, Present, and Future", NASA/TM-2005-213341, Aug. 2005, 20 pgs.

A. J. Nozik, "Exciton Multiplication and Relaxation Dynamics in Quantum Dots: Applications to Ultrahigh-Efficiency Solar Photon Conversion", Inorganic Chemistry, vol. 44, No. 20, 2005, pp. 6893-6899.

M. C. Hanna et al., "Quantum Dot Solar Cells with Multiple Exciton Generation", Presented at the 2005 DOE Solar Energy Technologies Program Review Meeting, Denver, Colorado, Nov. 7-10, 2005, 5 pgs.

M. G. Vavilov et al., "Photovoltaic and rectification currents in quantum dots", Physical Review B, vol. 71, (2005), pp. 241309-1-241309-4.

A. J. Nozik, "Quantum Structured Solar Cells", Nanostructured Materials for Solar Energy Conversion, (2006), pp. 485-516.

C. Strumpel et al., "Modifying the solar spectrum to enhance silicon solar cell efficiency—An overview of available materials", Solar Energy Materials & Solar Cells, (2006), pp. 1-12.

A. Luque et al., "Solar Cells Based on Quantum Dots: Multiple Exciton Generation and Intermediate Bands", MRS Bulletin, vol. 32, Mar. 2007, pp. 236-241.

P. Loper et al., "Efficient Upconversion Systems for Silicon Solar Cells", Presented at the 22nd European Photovoltaic Solar Energy Conference and Exhibition, Milan, Italy, Sep. 3-7, 2007, 6 pgs.

J. C. Campbell et al., "Quantum-Dot Infrared Photodetectors", Proceedings of the IEEE, vol. 95, No. 9, Sep. 2007, pp. 1815-1827.

S. Pillai et al., "Surface plasmon enhanced silicon solar cells", Journal of Applied Physics, vol. 101, May 2007, pp. 093105-1-093105-8.

V. Aroutiounian et al., "Quantum Dot Solar Cells", 2 pgs.

C. B. Honsberg, "Approaches for Ultra-High Efficiency Solar Cells", 3 pgs.

C. Strumpel et al., "Enhancing Silicon Solar Cell Efficiency by Modifying the Solar Spectrum", 4 pgs.

T. Trupke et al., "Up-and Down-Conversion as New Means to Improve Solar Cell Efficiencies", 4 pgs.

W.G.J.H.M. Van Sark et al., "Enhancing Solar Cell Efficiency by Using Spectral Converters", 1 pg.

W.G.J.H.M. Van Sark et al., "Improvement of Spectral Response of Solar Cells by Deployment of Spectral Converters Containing Semiconductor Nanocrystals", 4 pgs.

* cited by examiner

PHOTOVOLTAIC DEVICE WITH AN UP-CONVERTING QUANTUM DOT LAYER AND ABSORBER

BACKGROUND

Photovoltaic devices, also referred to as solar cells, convert light directly into electricity. The majority of photovoltaic devices use a semiconductor as an absorber layer with a well-defined bandgap, such as crystalline silicon with an energy bandgap $E_g$ of 1.1 eV. Photovoltaic devices include layers of semiconductor materials with different electronic properties. One of the layers of silicon can be "doped" with a small quantity of boron to give it a positive (or p-type) character. Another layer can be doped with phosphorus to give it a negative (or n-type) character. The p and n regions can be adjacent to each other or separated by an intermediate layer. The interface, or junction, between these two layers contains an electric field.

When light (i.e., photons) hits the device, some of the photons are absorbed in the region of the junction, freeing electrons and holes (i.e., carriers) in the absorber. If the photons have enough energy, the carriers will be driven out by the electric field and move through the silicon and into an external circuit.

Light with energy lower than the bandgap is not absorbed and is thus lost for photoelectric conversion. Light with energy E greater than the bandgap $E_g$ is absorbed. However, the excess energy $E-E_g$ is lost due to thermalization. It is well known that this results in an optimum choice for the bandgap of the absorber material. Invoking the principle of detailed balance, the optimum bandgap of a photovoltaic device has been found to be about 1.4 eV with a limiting conversion efficiency of 33%.

In single bandgap cells, only a fraction of the energy spectrum of the incident light is used for the energy conversion. For example, only a part of the energy of incident sunlight is available for photo conversion.

In the literature, several approaches to increase the utilization of the solar spectrum have been suggested. One approach is to construct the photovoltaic device out of a series of layers with different bandgap materials, where each layer reacts to a different portion of the solar spectrum. Another approach is to use the principle of multiple carrier generation, wherein light with high energy creates more than one electron per incoming photon, such that the thermalization losses are reduced.

Yet another approach is to employ "Intermediate Level Cells," in which a material with an additional electronic band (i.e., an intermediate band) is located in the energy gap between the valence band and the conduction band. Then absorption can occur from the valence band to the intermediate band, from the intermediate band to the conduction band, and from the valence band to the conduction band.

A variation of the intermediate bandgap cell is to use up-conversion or down-conversion of photons. In cells having a down-converter, a down-converter layer reduces the energy of the incident light before it passes to the absorber.

In cells having an up-converter, a part of the light energy with $E>E_g$ that enters the structure is absorbed in the usual way. The low energy portion of the light (i.e., where $E<E_g$) goes through the absorber with essentially no attenuation. In the up-converter, the photons are absorbed in two or more steps. After excitation, the electron-hole pairs recombine radiatively in one step, whereby they emit light of correspondingly higher energy. This emitted light is directed back to the absorber. In a properly designed system, the energy of the emitted light is greater than the absorber bandgap and the solar cell absorber has an opportunity to absorb energy of the lower energy part of the spectrum. The theoretical limit for the efficiency of an up-converting cell is 47.6%. In the literature, it has been suggested to use Erbium doped $NaYF_4$ as up-converting material, but the reported quantum efficiencies were very poor.

SUMMARY

In one aspect, the invention provides a photovoltaic apparatus comprising an absorber including a first quantum dot layer having a first plurality of quantum dots of a first quantum dot material in a first matrix material, and an up-converter layer positioned adjacent to the absorber layer, the up-converter layer including a second quantum dot layer having a second plurality of quantum dots of a second quantum dot material and a second matrix material.

DETAILED DESCRIPTION OF THE INVENTION

In one aspect, this invention provides a photovoltaic device that uses a quantum dot absorber layer and a quantum dot layer as a means for up-converting light. The quantum dot up-converter layer can be located underneath the quantum dot absorber layer. Low energy light that passes through the absorber layer is emitted back to the absorber by the up-converter layer, thus enhancing the conversion efficiency of the device.

Figure 1:
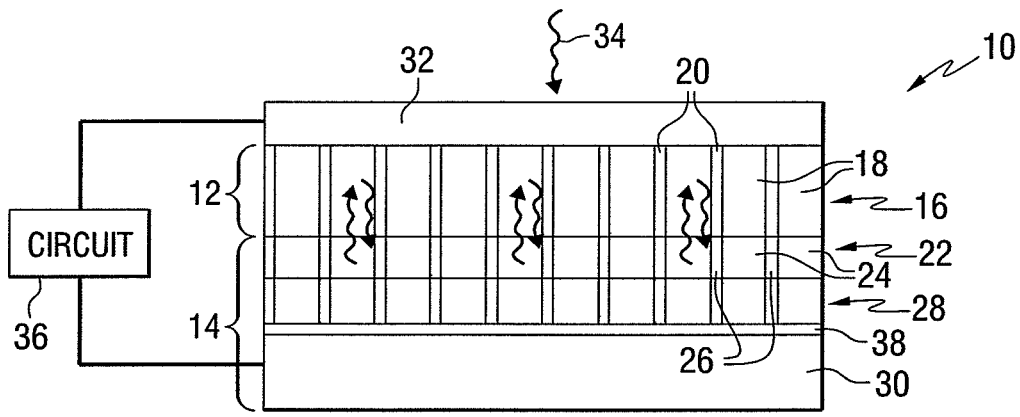
FIG. 1 is a schematic elevation view of a photovoltaic device constructed in accordance with a first aspect of the invention.

In one aspect, this invention provides a photovoltaic device including a quantum dot absorber layer and a quantum dot up-converter layer as illustrated in FIG. 1. FIG. 1 is a schematic representation of a photovoltaic device 10 including an absorber 12, and an up-converter 14 positioned adjacent to the absorber.

The absorber includes a quantum dot layer 16, which includes a plurality of quantum dots 18 of a first semiconductive material, separated by a first matrix material 20, which can be for example, a wide bandgap semiconductive material or an insulating material, such as, for example, $TiO_2$, $SiO_2$, ZnS, $Ta_2O_5$, or $Nb_2O_5$.

The up-converter layer includes a quantum dot layer 22 which includes a plurality of quantum dots 24 of a second semiconductive material. The up-converter layer quantum dots are separated by a second matrix material 26, which can be a wide bandgap semiconductor material, or an insulating material, such as, for example, $TiO_2$, $SiO_2$, ZnS, $Ta_2O_5$, or $Nb_2O_5$. The up-converter layer quantum dots can be formed on a seedlayer 28, which is supported by a substrate 30, which can be an amorphous metal. The substrate can also serve as a reflector. The seedlayer has a "hillock structure" that provides the template for the quantum dot's to grow. Underneath the seedlayer is an amorphous layer 38, which is continuous. While in principle, the amorphous layer could be the substrate, in practice the amorphous layer 38 is deposited in a separate step.

A transparent conductive oxide (TCO) electrode 32 is formed on top of the absorber. When light 34 (i.e., photons) hits the device, some of the photons are absorbed in the absorber, freeing electrons and holes, which then can move into an external circuit 36. In this example, the TCO electrode and the substrate serve as means for connecting the device to an external circuit.

Figure 2:
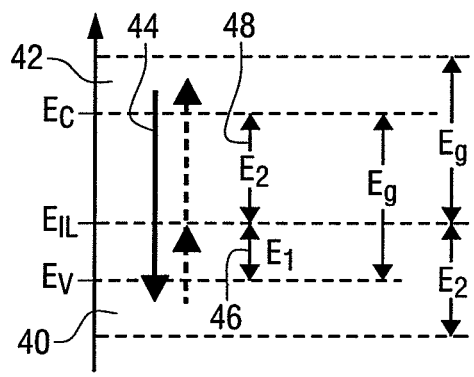
FIG. 2 is a schematic representation of energy levels in the device of FIG. 1.

FIG. 2 is a schematic representation of energy levels in the device of FIG. 1. $E_g$ is the energy gap between the valence band 40 and the conduction band 42. $E_V$ represents the energy level at the top of the valence band, $E_C$ represents the energy level at the bottom of the conduction band, and $E_{IL}$ represents an intermediate energy level. The low energy portion of the light (i.e., where $E<E_g$) goes through the absorber with essentially no attenuation. In the up-converter, the photons are absorbed in two or more steps. In this example, $E_1$ is the difference in energy between $E_V$ and $E_{IL}$, and $E_2$ is the difference in energy between $E_{IL}$ and $E_C$. After excitation, the electron-hole pairs recombine radiatively in one step as illustrated by arrow 44, whereby they emit light of correspondingly higher energy $E_{emit}=E_1+E_2$, as illustrated by arrows 46 and 48. This emitted light is directed back to the absorber, either directly or by being reflected by the reflector.

The utilization of quantum dots as an up-converter has the advantage that quantum dots provide a strong absorption and allow an easy way to control the energy levels, such as by changing the dot size. The quantum dots can be grown on suitable templates, which may be metallic in nature, that exhibit the ability to induce crystallographic texture in the semiconductor layer above. An example of a template that can be used to grow the quantum dots is described in a commonly owned U.S. Pat. No. 8,029,924, which is hereby incorporated by reference.

The up-conversion layer can be in the form of a two-dimensional sheet film structure that includes a matrix containing co-planar precipitates of quantum dot (QD) semiconductors. This configuration yields a very high coverage of the seedlayer surface with quantum dots enabling high optical absorption. Examples of the fabrication of the quantum layers are described below.

The semiconductor material that is used to form the quantum dots can be co-deposited with a second material, for example a wide bandgap semiconductor material or insulating material, such that the quantum dots nucleate as a precipitate in a matrix of the second material. The volume fraction of the quantum dot material in the quantum dot layers can be between about 40% and about 90%. The quantum dot material can be, for example, PbS, PbSe, InAs, InP, InN, InSb, CdS, CdSe, CdTe, $B_2S_3$, $Si_xGe_{1-x}$, $Bi_2S_3$, or AlSb. The matrix material can be, for example, $TiO_2$, $SiO_2$, ZnS, $Ta_2O_5$, or $Nb_2O_5$. The bandgap of the up-converter is typically selected such that it is lower than the bandgap of the absorber material.

The quantum dots and matrix material can be fabricated using a sputter deposition technique. The quantum dot layer can be fabricated in a process environment that is similar to the region of a Thornton Diagram known as Zone 1. Process conditions typical to the Thornton Diagram Zone 1 are low to moderate substrate temperatures (e.g., <40% homologous temperature), and relatively high sputter gas pressures (e.g., >20 mTorr).

In one example, the substrate temperature is <200° C. and the gas pressure is >30 mTorr Ar. This process configuration yields thin films with quantum dots in the form of columnar grain structures with varying amounts of porosity between neighboring quantum dots, also referred to as grains. Generally, the quantum dot and matrix materials should have surface energies between 2-3 J/m². Most materials with lower surface energy will tend to wet the surface, and most materials with higher surface energies will tend toward being amorphous.

Such a process facilitates the segregation of immiscible materials since the columnar grain structure becomes the quantum dot, while the immiscible matrix material is collected, or trapped, at the porous grain boundary regions, where it forms a connective matrix with low volume fraction. The quantum dot layers may resemble a honeycomb when viewed in plan view, where the matrix forms the honeycomb lattice and the quantum dots occupy the holes. Examples of suitable matrix materials, also referred to as segregates, include $TiO_2$, $SiO_2$, ZnS, $Ta_2O_5$, or $Nb_2O_5$.

Depending on the electrical characteristics of the sputter targets used in the deposition process, rf-magnetron or rf-diode cathodes may be used for the deposition. When using PbS for the dot material and $TiO_2$ for the matrix material, commercially available dc-magnetrons may be used. Dc-magnetrons offer flexibility in terms of processing pressure and may therefore be more desirable to use in a manufacturing setting. It may also be necessary to include the addition of gases such as $O_2$ or $H_2S$ or others during the co-deposition, so as to properly adjust the constituent stoichiometries of the semiconductor and the segregant. Such a co-deposition process leads to isolated semiconductor grain particles that have dimensions consistent with quantum confinement (e.g., about 2 nm to about 10 nm).

A log-normal distribution of grain diameters, d, can be expected. With optimization, it is possible to achieve $\sigma_d/d$ less than 20%, where $\sigma_d$ is the standard deviation of the grain sizes. In one example, the quantum dot layer thickness can range from about 2 nm to about 20 nm. In another example, the quantum dot layer thickness can range from about 2 nm to about 10 nm.

Suitable materials for the quantum dots include low bandgap materials, such as PbS, PbSe, InP, CdSe, CdS, InAs, InSb, $Si_xGe_{1-x}$ and so forth. The choice of the matrix material is discussed further below.

Some design rules for selecting the materials are as follows:

1. A particle can be considered a quantum dot, if the following relation holds $$\Delta x \approx \sqrt{3}\,\pi\sqrt{\frac{\hbar^2}{mk_BT}} \text{ where}$$

$\hbar$ =Planck's constant (i.e., approximately $6.626\times10^{-34}$ joule-seconds),
m=the effective electron mass,
$k_BT$=thermal energy,
$k_B$=1.38 $10^{-34}$ J/K, and
T=temperature in Kelvin,
that is, the particle diameter should be equal or less than $\Delta x$. The energy levels in these quantum dots are given by:

$$E = \frac{\pi^2\hbar^2}{2m}\left(\frac{n_x^2}{d_x^2} + \frac{n_y^2}{d_y^2} + \frac{n_z^2}{d_z^2}\right)$$

where $d_x$, $d_y$, and $d_z$ are the dimensions of the dot in the respective directions and $n_x$, $n_y$, and $n_z$ are integers (1, 2, 3, ...) and specify the quantization levels. It is therefore clear that a simple control of the size of the dots creates the necessary energy levels needed for an up-conversion process.

2. Materials that are best suited for up-converters are those in which electrons are allowed to relax after one of the intermediate steps, if this relaxation is combined with a change in selection rules for radiative transitions involving the relaxed state and the unrelaxed state, respectively. As stated above, an up-conversion is more likely to occur if there is a two-step process in which the selection rules change.

3. Ideally, the indices of refraction (i.e., the indices of the composite quantum dot and matrix layer) of the absorber and the up-converter should be matched.

The quantum dot up-converter layer can be grown on a structure having several layers. Suitable growth layers have two or more individual layers where the top layer or seedlayer is used to create the granular structure on which the quantum dots are grown. The seedlayer may include elements such as Al, Au, Ag, Pt, Pd, Cu, Ni, Rh, Ru, Co, Re, Os, Cr, Mo, V, Ta, V and multi-component alloys of the same elements. The seedlayer can be grown on amorphous metallic layers such as FeCoB or CrTa or other such amorphous metals/alloys. The seedlayer and the amorphous metallic layer can form a reflector that is used to reflect photons back to the absorber. Typical dot sizes are between about 5 nm and about 12 nm, with a thickness ranging from about 10 m to about 50 nm. The separation thickness of the dots is typically about 1 nm to about 3 nm.

The best growth of the quantum dot layer is achieved if the two materials, the up-converter and the absorber, are lattice matched.

Figure 3:
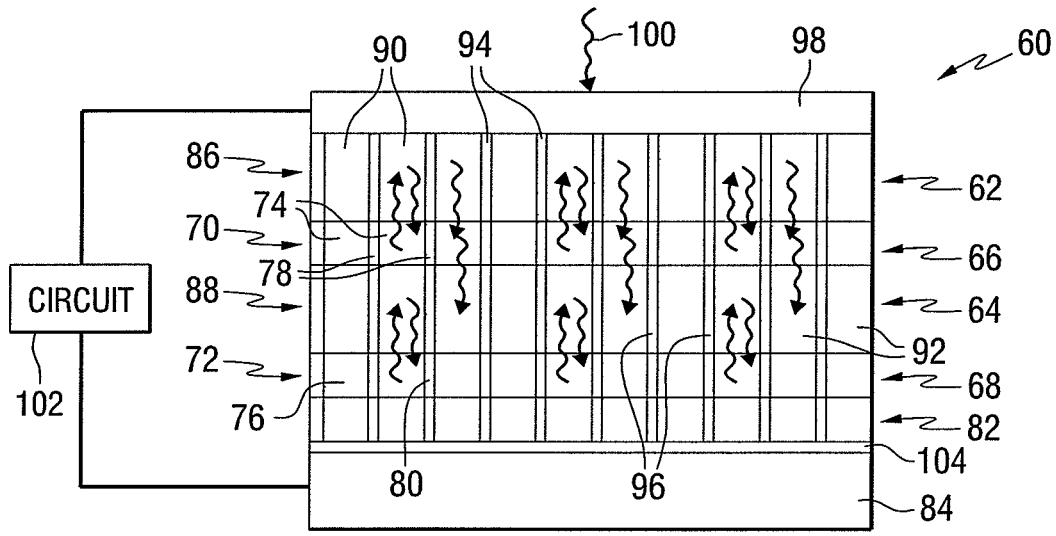
FIG. 3 is a schematic elevation view of a photovoltaic device constructed in accordance with another aspect of the invention.

FIG. 3 is a schematic representation of a photovoltaic device 60 including a plurality of absorbers 62, 64, and a plurality of up-converters 66, 68. Each up-converter layer includes quantum dot layers 70, 72, which includes a plurality of quantum dots 74, 76 of a semiconductive material. The quantum dots are separated by a matrix material 78, 80, which can be a wide bandgap semiconductor material or an insulating material such as for example $TiO_2$, $SiO_2$, ZnS, $Ta_2O_5$, or $Nb_2O_5$. The quantum dots in layer 70 can be formed on a seedlayer 82, which is supported by a substrate 84, which can be an amorphous metal. The substrate can also serve as a reflector. Underneath the seedlayer 82 is an amorphous layer 104, which is continuous. While in principle, the amorphous layer could be the substrate, in practice the amorphous layer 104 is deposited in a separate step.

The absorbers include quantum dot layers 86, 88, which include a plurality of quantum dots 90, 92 of a semiconductive material. The quantum dots are separated by a matrix material 94, 96, which can be a wide bandgap semiconductor material or an insulating material such as for example $TiO_2$, $SiO_2$, ZnS, $Ta_2O_5$, or $Nb_2O_5$. A transparent conductive oxide (TCO) electrode 98 is formed on top of the absorber. When light 100 (i.e., photons) hits the device, some of the photons are absorbed in the absorbers, freeing electrons and holes, which then will be moved to an external circuit 102. In this example, the TCO electrode and the substrate serve as means for connecting the device to an external circuit. The transparent electrode can be comprised of zinc oxide (ZnO), Al doped ZnO, indium tin oxide (ITO), $SnO_2$, or fluorinated $SnO_2$ with preferred thicknesses between about 50 nm and about 500 nm.

Another example uses a quantum dot layer for the absorber that has the capability to create more than one electron per incident photon. Such a structure can be realized in the same way as described above, but additionally one has to choose a wide bandgap semiconductor, such as $TiO_2$ as matrix material. The preferred crystal structure for the wide bandgap material is the anatase form of titanium dioxide. As anatase, the grain boundary becomes capable of accepting charge injection from a neighboring quantum dot. This design enables a higher current due to the multiple carrier generation.

The examples described above can be combined with light trapping measures. Light trapping measures include controlled texturing of the bottom reflector to increase the number of paths which the light can make through the absorber, and the up-conversion layer in this case, or controlled roughening of the top surface. Alternatively, plasmon layers can be used to enable multiple passes of the light through the absorber. Additionally, anti-reflection coatings can be applied to the layers.

While the invention has been described in terms of several examples, it will be apparent to those skilled in the art that various changes can be made to the disclosed examples, without departing from the scope of the invention as set forth in the following claims. The implementations described above and other implementations are within the scope of the following claims.

What is claimed is:

1. A photovoltaic apparatus comprising:
a photovoltaic absorber including a first quantum dot layer having a first plurality of quantum dots of a first quantum dot material in a first matrix material; and
an up-converter layer positioned adjacent to the absorber layer, the up-converter layer including a second quantum dot layer having a second plurality of quantum dots of a second quantum dot material and a second matrix material, wherein the first and second matrix materials each comprise a wide bandgap semiconductor material or an insulating material, and wherein the first and second quantum dot layers are lattice matched and wherein the first and second quantum dot materials comprise one or more of: PbS, PbSe, InP, CdSe, CdS, InAs, InSb, and $Si_xGe_{1-x}$.

2. The apparatus of claim 1, wherein the up-converter has lower bandgap than the first quantum dot material.

3. The apparatus of claim 1, wherein the volume fraction of the quantum dots in the first quantum dot layer is between about 40% and about 90%.

4. The apparatus of claim 1, wherein the quantum dots in the second quantum dot layer form a columnar grain structure.

5. The apparatus of claim 1, wherein the first and second matrix materials comprise one or more of: $TiO_2$, $SiO_2$, ZnS, $Ta_2O_5$, or $Nb_2O_5$.

6. The apparatus of claim 1, wherein the surface energies of the first and second quantum dot materials and the first and second matrix materials are between 2 and 3 $J/m^2$.

7. The apparatus of claim 1, wherein the up-converter layer has a thickness of about 2 nm to about 50 nm.

8. The apparatus of claim 1, wherein the up-converter layer has a thickness of about 2 nm to about 10 nm.

9. The apparatus of claim 1, further comprising:
a substrate layer; and
a seedlayer between the substrate layer and the second quantum dot layer.

10. The apparatus of claim 9, further comprising:
an amorphous layer between the substrate and the seedlayer, wherein the seedlayer and the amorphous layer form a reflector.

11. The apparatus of claim 9, wherein the seedlayer comprises one or more of: Al, Au, Ag, Pt, Pd, Cu, Ni, Rh, Ru, Co, Re, Os, Cr, Mo, V, Ta, V, and alloys thereof.

12. The apparatus of claim 9, wherein the substrate comprises: FeCoB or CrTa.

13. The apparatus of claim 1, wherein the second plurality of quantum dots have a size in a range of between about 5 nm and about 12 nm.

14. The apparatus of claim 1, wherein the second plurality of quantum dots have a thickness in a range of between about 10 nm and about 50 nm.

15. The apparatus of claim 1, wherein the second plurality of quantum dots are separated from each other by a distance in a range of between about 1 nm and about 3 nm.

16. The apparatus of claim 1, further comprising:
  a first electrode electrically connected to the absorber; and
  a second electrode electrically connected to the up-converter layer.

17. The apparatus of claim 16, wherein the absorber and the up-converter layer have matched indexes of refraction.

18. The apparatus of claim 17, wherein the second electrode comprises one or more of: Al doped ZnO, ZnO, ITO, $SnO_2$ and fluorinated $SnO_2$.

19. The apparatus of claim 17, wherein the second electrode has a thickness in a range of between about 50 nm and about 500 nm.

20. The apparatus of claim 9, wherein the seed layer provides a template for growing at least the second plurality of quantum dots, and wherein the second matrix material is immiscible with the second quantum dot material such that the second matrix material collects at the grain boundaries of the second matrix material to form a connective matrix with low volume fraction.

\* \* \* \* \*